United States Patent
Huang et al.

(12)

(10) Patent No.: US 6,647,995 B1
(45) Date of Patent: Nov. 18, 2003

(54) METHOD AND SYSTEM FOR ELIMINATING POST ETCH RESIDUES

(75) Inventors: Jiahua Huang, San Jose, CA (US);
Yue-Song He, San Jose, CA (US);
Frank Mak, San Francisco, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 141 days.

(21) Appl. No.: 09/894,569

(22) Filed: Jun. 27, 2001

(51) Int. Cl.[7] .................................................. B08B 7/00
(52) U.S. Cl. .............................. 134/1.3; 134/1; 134/1.1; 134/1.2; 216/62; 216/87
(58) Field of Search .................. 216/62, 87; 134/1, 134/1.1, 1.2, 1.3; 156/345.4, 345.54; 204/192.34, 298.36

(56) References Cited

U.S. PATENT DOCUMENTS

| 5,003,178 A | * | 3/1991 | Livesay ................... 250/492.3 |
| 6,105,589 A | * | 8/2000 | Vane .......................... 134/1.1 |
| 6,204,201 B1 | * | 3/2001 | Ross .......................... 438/778 |

* cited by examiner

*Primary Examiner*—Rodney G. McDonald
(74) *Attorney, Agent, or Firm*—Wagner, Murabito & Hao LLP

(57) ABSTRACT

A method and system for eliminating post etch residues is disclosed. In one method embodiment, the present invention recites disposing a surface, having post etch residues adhered thereto, proximate to an electron beam source which generates electrons. The present method embodiment then recites bombarding the post etch residues with the electrons such that the post etch residues are removed from the surface to which the post etch residues were adhered.

13 Claims, 5 Drawing Sheets

METHOD AND SYSTEM FOR ELIMINATING POST ETCH RESIDUES

TECHNICAL FIELD

The present claimed invention relates to the field of semiconductor processing. More specifically, the present claimed invention relates to the removal of post etch residues during semiconductor processing.

BACKGROUND ART

The geometries of semiconductor devices are aggressively being scaled smaller and smaller to meet cost reduction and real estate requirements. Consequently, more polymers are needed during etch processes to protect exposed sidewalls and underlying layers while maintaining tight profile control and better etch selectively. As a result of the use of the additional polymers, complete and thorough polymer removal is becoming increasingly challenging.

Also, semiconductor fabrication processes are also now incorporating various new materials including: new multiple dielectrics, metals, and resists, to achieve better device performance. The recently incorporated new materials have also necessitated the development of new etch processes. Some of the new etch sources for etching the new materials have complex etch chemistries which, in turn, create new etch residues. Traditionally, wet or dry clean processes, or their combinations, are used to ensure etch residue removal and to achieve the required low-contact resistance in, for example, vias. Experiments have shown, however, that conventional wet or dry clean processes cannot effectively remove the etch residues especially in high respect ratio etch environments such as, for example, via etching. Attempts have also been made to introduce fluorine-based chemicals within a low temperature cleaning process, but such fluorine-based chemicals deleteriously damage oxide-based dielectric materials. Also, conventional wet clean process steps typically require the use of a solvent that can be toxic, costly to use and dispose of, and which is difficult to handle. Moreover, in many cases, the chemical reactions occurring during the wet clean processes do. not produce enough activation energy to remove all of the etch residues. As a result, deleterious post etch residues remain, for example, in vias of the semiconductor devices being formed. Post etch residues which remain in contact holes, vias, or various other structures of the semiconductor device may ultimately result in device failure.

In yet another conventional approach, a dry clean process is employed in an attempt to remove post etch residues. Conventional dry cleaning approaches are based on a plasma process. The traditional plasma excitation source used in a dry clean process can damage the semiconductor device due to the relatively large number of high-energy ions present in the plasma region. These high-energy ions can sputter chamber walls, create dielectric damage, and form unwanted driven-in mobile ions within the semiconductor wafer. Hence, traditional plasma-based dry clean processes have corresponding disadvantages which render them poorly suited to the removal of post etch residues.

In still another conventional approach, microwave downstream plasma processing has been employed to remove post etch residues. The microwave downstream plasma process offers low damage performance. Unfortunately, however, the microwave downstream plasma process requires that the semiconductor wafers be heated to quite high temperatures. Specifically, in order to achieve a reasonable throughput, conventional microwave downstream plasma processes require heating the semiconductor wafer to temperatures in the range of 200 degrees Celsius or higher. The use of such high temperatures can cause post etch polymer residues to harden on the wafer, thereby rendering their removal even more difficult.

As yet another concern, in order to achieve widespread acceptance, and to ensure affordability, any method of removing post etch residues, which overcomes the above-listed drawbacks, should be compatible with existing semiconductor fabrication processes.

Thus, the need has arisen for a method and system to remove post etch residues. Another need exists for a method and system which meet the above needs and which does not suffer from the disadvantages associated with conventional post etch residue removal approaches. Yet another need exists for a method and system for removing post etch residues which meet the above needs and which are compatible with existing semiconductor fabrication processes such that significant revamping of semiconductor capital equipment is not required.

DISCLOSURE OF THE INVENTION

The present invention provides a method and system to remove post etch residues. The present invention further provides a method and system which achieve the above accomplishments and which does not suffer from the disadvantages associated with conventional post etch residue removal approaches. The present invention also provides a method and system for removing post etch residues which achieve the above accomplishments and which are compatible with existing semiconductor fabrication processes such that significant revamping of semiconductor capital equipment is not required.

Specifically, in one method embodiment the present invention recites disposing a surface, having post etch residues adhered thereto, proximate to an electron beam source which generates electrons. The present method embodiment then recites bombarding the post etch residues with the electrons such that the post etch residues are removed from the surface to which the post etch residues were adhered.

In another embodiment, the present invention includes the steps of the above-described embodiment and further recites transporting the loosened post etch residues away from the surface, to which the post etch residues were adhered, by creating a vacuum proximate the surface.

These and other technical advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
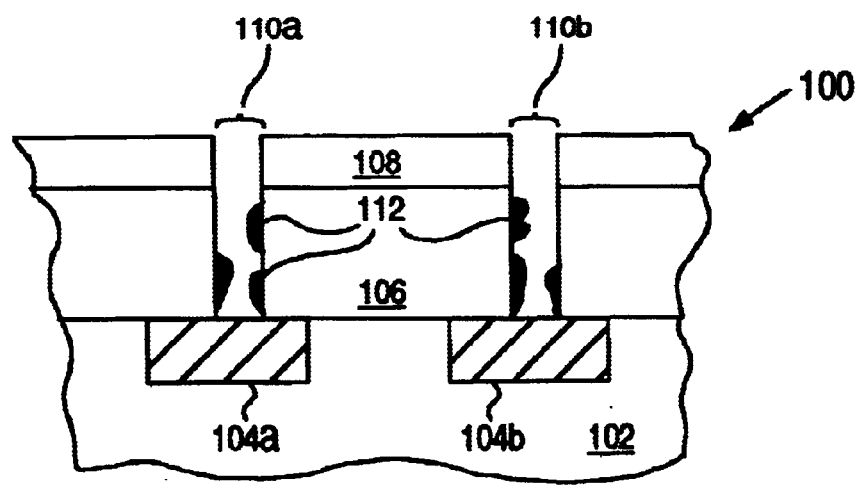
FIG. 1 is a side sectional view of a semiconductor structure having unwanted post etch residues disposed within a via.

With reference now to Prior Art FIG. 1, a side sectional view of a semiconductor structure 100 is shown. Specifically, semiconductor structure 100 includes a semiconductor substrate 102, contact regions 104a and 104b, a dielectric layer 106, and an overlying photoresist layer 108. Openings or vias 110a and 110b are shown formed extending through photoresist layer 108 and dielectric layer 106 such that contact regions 104a and 104b are exposed. It should be noted that structure 100 is cited as an exemplary structure only, and that the present method and system are well suited to use various other types and configurations of semiconductor structures. That is, as will be described in detail below, the post etch residue removal method and system of the present embodiments are not limited solely to use with the structure shown in Prior Art FIG. 1.

With reference still to Prior Art FIG. 1, post etch residues, typically shown as 112, are shown disposed within vias 110a and 110b. As mentioned above, as the geometries of semiconductor devices are aggressively being scaled smaller and smaller to meet cost reduction and real estate requirements, more polymers are needed during etch processes to protect exposed sidewalls and underlying layers. As a result of the use of the additional polymers, complete and thorough polymer removal is becoming increasingly difficult. Hence, post etch residues of polymer material may remain in contact holes, vias, or various other structures. The presence of such polymer post etch residues may ultimately result in device failure. As will be described below, the present embodiments provide a method and system for removing post etch residues such as residues 112 of Prior Art FIG. 1. For purposes of clarity, the following discussion will utilize the side sectional views of FIGS. 1–4 in conjunction with FIG. 5 and flow charts 600 and 700 of FIGS. 6 and 7, respectively, to clearly describe the various embodiments of the present invention.

Figure 2:
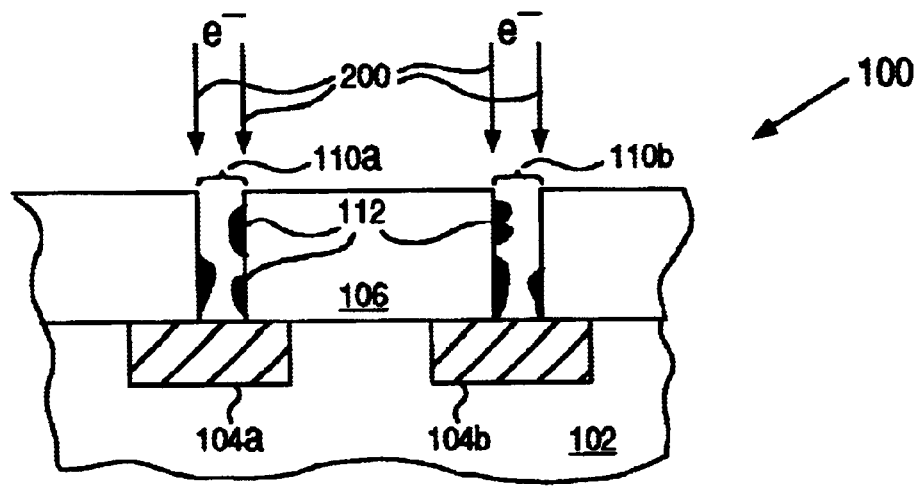
FIG. 2 is a side sectional view of the structure of PRIOR ART FIG. 1 after having a layer of photoresist removed therefrom and depicting bombarding of unwanted post etch residues with electrons in accordance with one embodiment of the present claimed invention.
Figure 6:
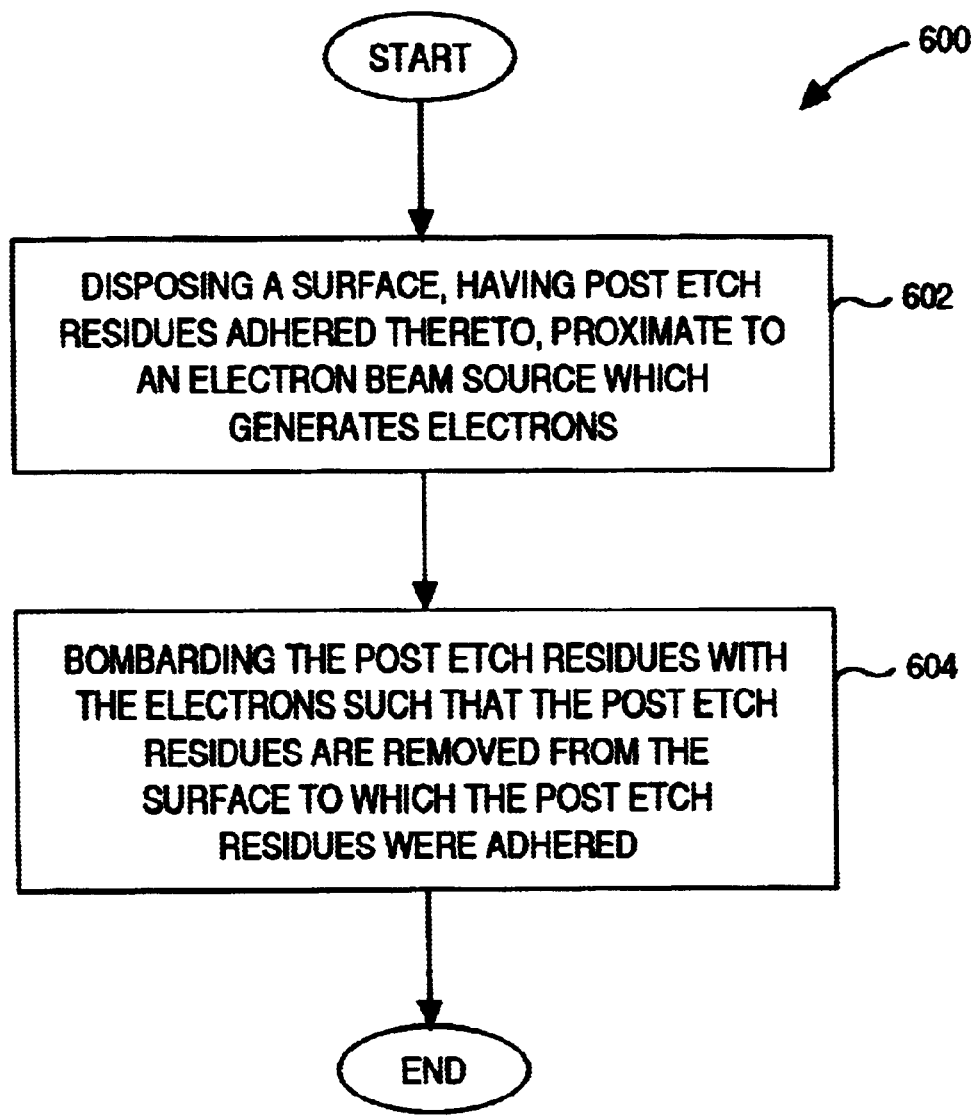
FIG. 6 is a flow chart of steps performed to remove post etch residues in accordance with one embodiment of the present claimed invention.

With reference now to step 602 of flow chart 600 of FIG. 6, and also to FIG. 2, one method embodiment of the present invention recites disposing a surface, having post etch residues adhered thereto, proximate to an electron beam source which generates electrons. Arrows 200 of FIG. 2 are intended to represent the directional path of electrons which are generated by the electron beam source. In one embodiment, the electron beam source is disposed within an electron beam-based inspection tool. As shown in FIG. 2, in the present embodiment, photoresist layer 108 of Prior Art FIG. 1 has been removed.

Figure 5:
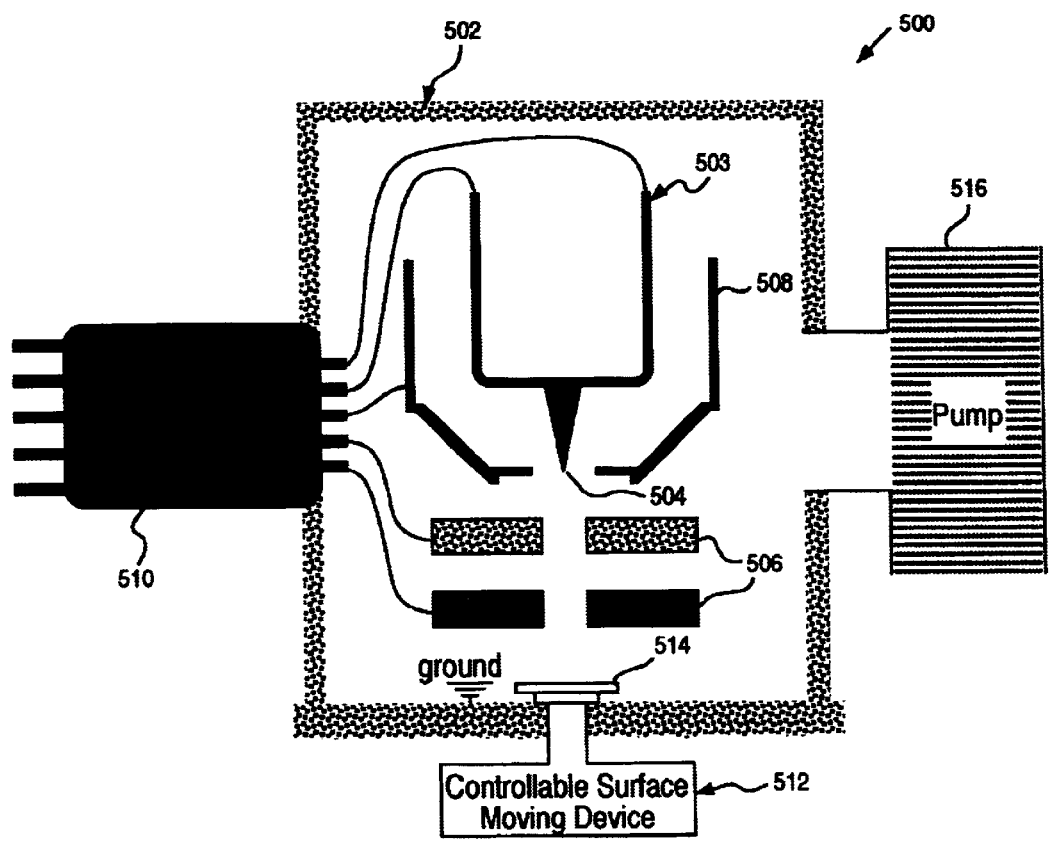
FIG. 5 is a schematic depiction of a system used to remove post etch residues in accordance with one embodiment of the present claimed invention.

Referring now to FIG. 5, a schematic diagram of one embodiment of a post etch residue removal system 500 is shown. In one embodiment, post etch removal system 500 includes an electron beam-based inspection tool 502 comprised of: an electron generating portion 503 (having an electron emission tip 504), electron focusing lenses 506, a suppressor portion 508, and a power and control source 510. System 500 of the present embodiment further includes a controllable surface moving device unit 512 coupled to electron beam-based inspection tool 502. Controllable surface moving device unit 512 is adapted to move a semiconductor structure, typically shown as 514, such that electrons emitted from electron emission tip 504 will impinge the desired location on semiconductor structure 514. In another embodiment, a vacuum source 516 is coupled to electron beam-based inspection tool 502.

Referring again to FIG. 2, and to step 602 of flow chart 600 of FIG. 6 in one method embodiment, a present invention recites disposing a surface, having post etch residues adhered thereto, proximate to an electron beam source which generates electrons. As mentioned above, post etch residue removal system 500 of FIG. 5 includes a controllable surface moving device unit 512 which is adapted to move a semiconductor structure such that electrons emitted from electron emission tip 504 will impinge the desired location on semiconductor structure. More particularly, in one embodiment of the present invention, semiconductor structure 100 of FIG. 2 is located with respect to electron beam-based inspection tool 502 such that generated electrons are directed towards openings 110a and 110b. In one embodiment, the position of semiconductor structure 100 is repeatedly adjusted such that numerous desired regions are disposed proximate to the path of the generated electrons.

With reference now to step 604 of flow chart 600 and still to FIG. 2, the present method embodiment recites bombarding the post etch residues with the electrons such that the post etch residues are removed from the surface to which the post etch residues were adhered. More specifically, in the present embodiment, post etch residues 112 are bombarded with electrons generated by electron beam-based inspection tool 502 of FIG. 5 such that post etch residues 112 are removed from within vias 110a and 110b. The bombarding electrons break the loose bonds between the polymer and materials which are adhered by polymer, and efficiently evaporate the polymer post etch residues. In the present embodiment, electron beam-based inspection tool 502 provides a low energy electron beam source. That is, electron beam-based inspection tool 502 operating with an accelerating voltage of approximately 1000–3000 volts, with a probe current of approximately $1.0\times10^{-9}$ to $1.0\times10^{-12}$ Amperes, and a total energy of approximately $1.0\times10^{-7}$ Watts.

The low energy electron beam source of the present embodiments has distinct advantages associated therewith. Namely, unlike some conventional post etch residue removal methods (e.g. traditional plasma dry clean processes) which employ high energy ion sources, the low energy electrons of the present embodiment remove the post etch residues without the sputtering of chamber walls, without damaging dielectric materials, and without inducing mobile ion drive-in. As yet another advantage, conventional processes such as, for example, conventional wet clean processes, the present embodiments remove post etch residues without the use of toxic waste generating chemicals. Furthermore, unlike conventional microwave downstream plasma processing, the present embodiments remove the post etch residues without significantly heating the post etch residues and the surface to which the post etch residues were adhered. Hence, in the present invention, chemicals are saved and the environment is protected as no chemical agent is needed in the present invention. Moreover, the present invention is a substantially damage-free process because the total energy is $1.0\times10^{-7}$ Watts as compared to the lowest damage form of conventional down stream dry etching which has a total energy of approximately 100 Watts.

Figure 3:
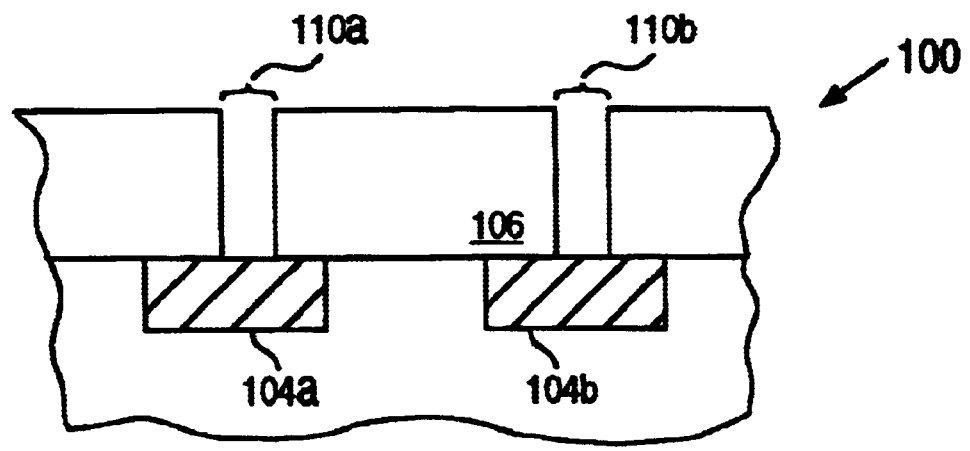
FIG. 3 is a side sectional view of the structure of FIG. 2 after the post etch residues have been removed by electron bombardment in accordance with one embodiment of the present claimed invention.
Figure 4:
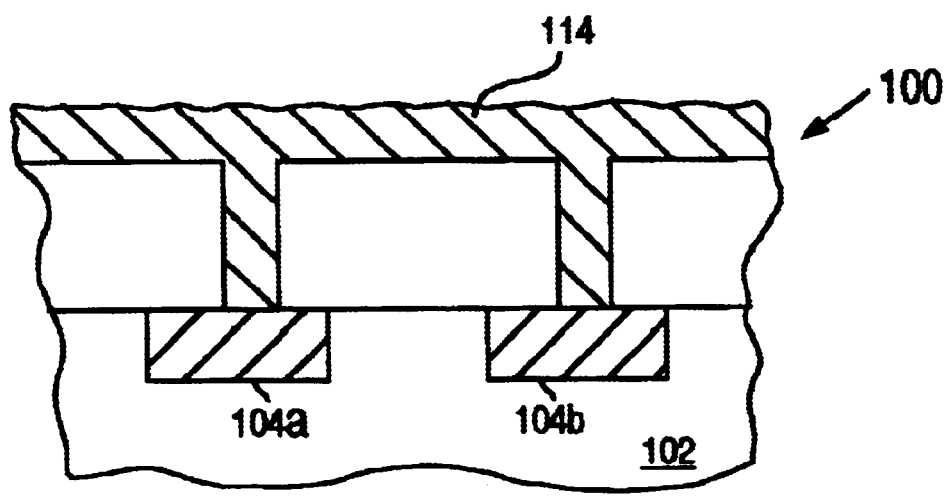
FIG. 4 is a side sectional view of the structure of FIG. 4 after the deposition of a layer of metal.

With reference now to FIG. 3, a side sectional view of the structure 100 of FIG. 2 is shown after post etch residues 112 have been removed therefrom in accordance with one embodiment of the present claimed invention. As shown in FIG. 3, openings 110a and 110b are free of post etch residues. As a result, subsequent processing steps can be performed without concern for post etch residue-induced defects. Subsequent processing step may include, for example, deposition of an overlying metal layer 114 as shown in FIG. 4. Although such a subsequent processing step is shown in FIG. 4, such a step is exemplary only, and the present invention is well suited to use with various other subsequent processing steps as well. Additionally, the present invention is well suited to performing steps 602 and 604 of FIG. 6, at process stages other than as depicted in FIGS. 2 and 3.

Figure 7:
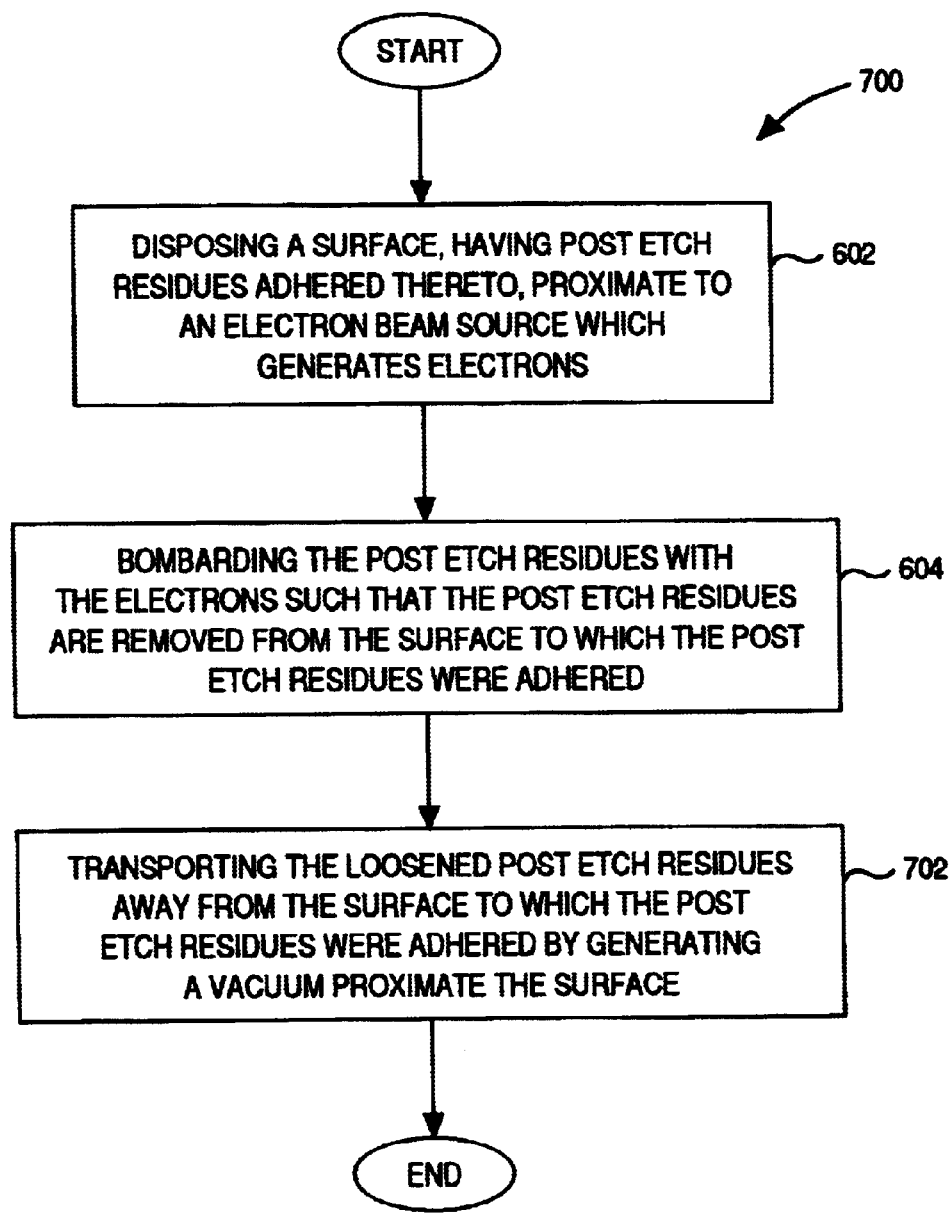
FIG. 7 is a flow chart of steps performed to remove post etch residues in accordance with another embodiment of the present claimed invention.

With reference now to FIG. 7, a flow chart 700 of steps performed in accordance with another embodiment of the present invention is shown. The embodiment of FIG. 7 includes the same steps (602–604) as were recited and described above in detail in conjunction with the description of the embodiments of FIG. 6. For purposes of clarity and brevity, a discussion of steps 602–604 is not repeated here. The embodiment of FIG. 7, and particularly step 702 recites transporting the post etch residues, which have been removed from the surface, away from the surface to which the post etch residues, 112 of FIG. 2, were previously adhered. In one embodiment of the present invention, the loosened post etch residues are transported away from the surface, to which the post etch residues were adhered, by creating a vacuum proximate to the surface. More particularly, in one embodiment, post etch removal system 500 of FIG. 5 includes a vacuum pump 516 for creating a vacuum proximate to semiconductor structure 514. The vacuum causes the loosened post etch residues to move away from the semiconductor structure 514, and enables subsequent exhausting of the loosened particles. In one embodiment, a vacuum of approximately $5.0\times10^{-7}$ Pascals is created by post etch removal system 500 proximate to semiconductor structure 514. As yet another benefit, the vacuum created post etch removal system 500 can also remove residues which were left traditional dry and wet clean processes prior to the removal of post etch residues.

Beneficially, the method and system of the present embodiments are realized using existing semiconductor fabrication devices and processes such that significant revamping of semiconductor capital equipment is not required. As a result, the present embodiments do not require significant costs to implement.

Thus, the present invention provides a method and system to remove post etch residues. The present invention further provides a method and system which achieve the above accomplishments and which does not suffer from the disadvantages associated with conventional post etch residue removal approaches. The present invention also provides a method and system for removing post etch residues which achieve the above accomplishments and which are compatible with existing semiconductor fabrication processes such that significant revamping of semiconductor capital equipment is not required.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for removing post etch residues using an electron beam-based inspection tool comprising a focussed electron beam source, said method comprising the steps of:

a) disposing a surface, having post etch residues adhered thereto, proximate to said focussed electron beam source which generates electrons; and b) bombarding said post etch residues with said electrons such that said post etch residues are removed from said surface to which said post etch residues were adhered.

2. The method for removing post etch residues as recited in claim 1 wherein step a) comprises disposing said surface proximate to said electron beam source by controllably moving a structure, on which said surface is located, with respect to said electron beam source.

3. The method for removing post etch residues as recited in claim 1 wherein step b) comprises bombarding said post etch residues with said electrons generated by said focussed electron beam source at an accelerating voltage of approximately 1000–3000 volts.

4. The method for removing post etch residues as recited in claim 1 wherein step b) comprises bombarding said post etch residues with said electrons generated by said electron beam-based inspection tool operating with a probe current of approximately $1.0\times10^{-9}$ to $1.0\times10^{-12}$ Amperes.

5. The method for removing post etch residues as recited in claim 1 wherein step b) comprises bombarding said post etch residues with said electrons generated by said electron beam-based inspection tool operating with a total power of approximately $1.0\times10^{-7}$ Watts.

6. The method for removing post etch residues as recited in claim 1 wherein steps a) and b) are performed without the use of toxic waste generating chemicals.

7. The method for removing post etch residues as recited in claim 1 wherein steps a) and b) are performed without significantly heating said post etch residues and the surface to which said post etch residues were adhered.

8. The method for removing post etch residues as recited in claim 1 further comprising the step of:

c) transporting said post etch residues, which have been removed from said surface, away from said surface to which said post etch residues were previously adhered.

9. The method for removing post etch residues as recited in claim 8 wherein step c) comprises transporting said post etch residues away from said surface, to which said post etch residues were adhered, by creating a vacuum proximate said surface.

10. A method for removing post etch residues using an electron beam-based inspection tool comprising a focussed electron beam source, said method comprising the steps of:

a) disposing a surface, having post etch residues adhered thereto, proximate to said focussed electron beam source which generates electrons, said surface disposed proximate said focussed electron beam source by controllably moving a structure, on which said surface is located, with respect to said electron beam source;

b) bombarding said post etch residues with said electrons such that said post etch residues are removed from said surface to which said post etch residues were adhered, said steps a) and b) performed without the use of toxic waste generating chemicals, without significantly heating said post etch residues and the surface to which said post etch residues were adhered; and c) transporting said post etch residues away from said surface to which said post etch residues were adhered by generating a vacuum proximate said surface.

11. The method for removing post etch residues as recited in claim 10 wherein step b) comprises bombarding said post etch residues with said electrons generated by said electron beam-based inspection tool adapted to operate with an accelerating voltage of approximately 1000–3000 volts.

12. The method for removing post etch residues as recited in claim 10 wherein step b) comprises bombarding said post etch residues with said electrons generated by said electron beam-based inspection tool adapted to operate with a probe current of approximately $1.0 \times 10^{-9}$ to $1.0 \times 10^{-12}$ Amperes.

13. The method for removing post etch residues as recited in claim 10 wherein step b) comprises bombarding said post etch residues with said electrons generated by said electron beam-based inspection tool adapted to operate with a total power of approximately $1.0 \times 10^{-7}$ Watts.

* * * * *